US006800497B2

(12) United States Patent
Wang et al.

(10) Patent No.: US 6,800,497 B2
(45) Date of Patent: Oct. 5, 2004

(54) POWER SWITCHING TRANSISTOR AND METHOD OF MANUFACTURE FOR A FLUID EJECTION DEVICE

(75) Inventors: Stanley J. Wang, Albany, OR (US); George H. Corrigan, Corvallis, OR (US); Tim R. Koch, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 92 days.

(21) Appl. No.: 10/135,600

(22) Filed: Apr. 30, 2002

(65) Prior Publication Data

US 2003/0202023 A1 Oct. 30, 2003

(51) Int. Cl.[7] .......................... H01L 21/00
(52) U.S. Cl. .......................... 438/21; 438/286
(58) Field of Search .......................... 438/48, 54, 55, 438/217, 230, 286, 303, 592, 595, 21

(56) References Cited

U.S. PATENT DOCUMENTS

| | | | | |
|---|---|---|---|---|
| 5,541,629 | A | 7/1996 | Saunders et al. | |
| 5,739,572 | A | 4/1998 | Noguchi | |
| 5,830,790 | A | 11/1998 | Kim et al. | |
| 5,850,360 | A | 12/1998 | Vajana et al. | |
| 5,880,502 | A | 3/1999 | Lee et al. | |
| 5,946,012 | A | 8/1999 | Courian et al. | |
| 5,966,608 | A | 10/1999 | Gong et al. | |
| 6,040,601 | A | 3/2000 | Gong et al. | |
| 6,043,534 | A | 3/2000 | Sogo | |
| 6,130,133 | A | 10/2000 | Tung | |
| 6,133,606 | A | 10/2000 | Tung | |
| 6,262,459 | B1 | 7/2001 | Tung | |
| 6,306,700 | B1 | 10/2001 | Yang | |
| 2002/0125540 | A1 * | 9/2002 | Shimotsusa et al. | 257/467 |

OTHER PUBLICATIONS

Basin, C et al., "High–Voltage CMOS Devices Compatible with Standard Low–Voltage CMOS Technologies," Internet http://legwww.epfl.ch/research/pd/cmos_hvf.pdf.

"High Voltage CMOS Solutions," AMIS Foundry Services website, Internet http://www.amis.com/foundry/cmos.cfm.

Nandra, Navraj S., "High Voltage Sub–micron CMOS Technology Challenges," May 19, 2000, Internet http://www.e-wh.ieee.org/r6/scv/scv_sscmay2000.html.

* cited by examiner

*Primary Examiner*—Matthew Smith
*Assistant Examiner*—Igwe U. Anya

(57) ABSTRACT

A method of manufacturing a power switching transistor for a fluid ejection device includes forming a first conductivity type region and a first diffused region within the first conductivity type region. The first diffused region has a first conductivity type and has a greater impurity concentration than the first conductivity type region. A gate is formed and is defined to have a thin oxide region and a thick oxide region. The thick oxide region and a first portion of the thin oxide region are disposed over the first conductivity type region and the thin oxide region is at a defined distance from the first diffused region.

17 Claims, 8 Drawing Sheets

POWER SWITCHING TRANSISTOR AND METHOD OF MANUFACTURE FOR A FLUID EJECTION DEVICE

THE FIELD OF THE INVENTION

The present invention relates generally to fluid ejection devices, and more particularly to a power switching transistor for a fluid ejection device.

BACKGROUND OF THE INVENTION

One type of conventional fluid ejection system is an inkjet printing system which includes a printhead, a fluid supply which supplies liquid ink to the printhead, and an electronic controller which controls the printhead. The printhead ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

Typically, the printhead ejects the ink drops through the nozzles by rapidly heating a small volume of ink located in vaporization chambers with small electric heaters, such as thin film resistors. Heating the ink causes the ink to vaporize and be ejected from the nozzles. Typically, for one dot of ink, a printhead controller controls activation of an electrical current from a power supply. The electrical current is passed through a selected thin film resistor to heat the ink in a corresponding selected vaporization chamber.

In one type of printhead, a power switching device, such as a field effect transistor (FET), is coupled to each thin film resistor to control the application of the electrical current through the thin film resistors. Power is supplied to the thin film resistors via a power supply, which is included as part of the inkjet printing system.

Printer system designs are trending toward the use of printheads with greater numbers of nozzles, more dots per inch, larger swath heights and higher firing frequencies. These features allow for faster printing with higher resolution. Increasing the resistance of the thin film resistors is one way to enable the desired features. This is because the common mode energy variation typically associated with higher nozzle counts can be reduced by using higher resistance thin film resistors. However, this requires the use of higher voltages and power switching devices that can support these voltages. This is because to heat the ink, FETs supply power to the thin film resistors where the power consumed by the thin film resistors is equal to $V^2/R$, where V is the operating voltage supplied to the FET and R is the value of the thin film resistor. Thus, if higher resistance thin film resistors are used, higher operating voltages are required to reach the turn-on energy of a print head.

For reasons stated above and for other reasons presented in the Detailed Description section of the present specification, an approach is desired which will increase the operating voltage level of the FETs used to supply power to thin film resistors in inkjet printheads.

SUMMARY OF THE INVENTION

One aspect of the present invention provides a method of manufacturing a power switching transistor for a fluid ejection device. The method includes forming a first conductivity type region. The method includes forming a first diffused region within the first conductivity type region, wherein the first diffused region has a first conductivity type and has a greater impurity concentration than the first conductivity type region. The method includes forming a gate defined to have a thin oxide region and a thick oxide region. The thick oxide region and a first portion of the thin oxide region are disposed over the first conductivity type region. The thin oxide region is at a defined distance from the first diffused region.

DETAILED DESCRIPTION

Figure 1:
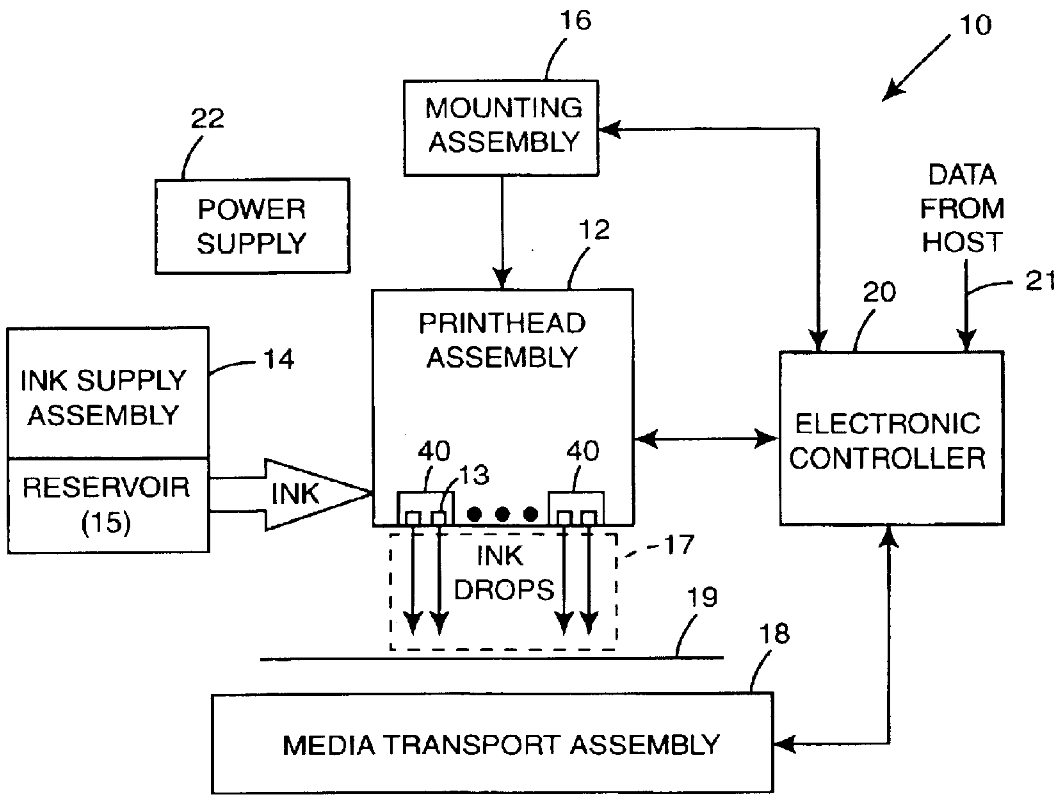
FIG. 1 is a block diagram illustrating one embodiment of an inkjet printing system.

In the following detailed description of the preferred embodiments, reference is made to the accompanying drawings which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. The fluid ejection system and related components of the present invention can be positioned in a number of different orientations. As such, the directional terminology is used for purposes of illustration and is in no way limiting. It is to be understood that other embodiments may be utilized and structural or logical changes may be made without departing from the scope of the present invention. Furthermore, the dimensions illustrated in the drawings are not to scale and are for illustration purposes only. The following detailed description, therefore, is not to be taken in a limiting sense, and the scope of the present invention is defined by the appended claims.

FIG. 1 illustrates one embodiment of a fluid ejection system referred to as an inkjet printing system 10 which ejects ink. Other embodiments of fluid ejection systems include printing and non-printing systems, such as medical fluid delivery systems, which eject fluids including liquids, such as water, ink, blood, photoresist, or organic light-emitting materials, or flowable particles of a solid, such as talcum powder or a powered drug.

In one embodiment, the fluid ejection system includes a fluid ejection assembly, such as an inkjet printhead assembly 12; and a fluid supply assembly, such as an ink supply assembly 14. In the illustrated embodiment, inkjet printing system 10 also includes a mounting assembly 16, a media transport assembly 18, and an electronic controller 20. At least one power supply 22 provides power to the various electrical components of inkjet printing system 10. In one embodiment, the fluid ejection assembly includes at least one fluid ejection device, such as at least one printhead or printhead die 40. In the illustrated embodiment, each printhead 40 ejects drops of ink through a plurality of orifices or nozzles 13 and toward a print medium 19 so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes characters, symbols, and/or other graphics or images to be printed upon print medium 19 as inkjet printhead assembly 12 and print medium 19 are moved relative to each other.

Ink supply assembly 14 supplies ink to printhead assembly 12 and includes a reservoir 15 for storing ink. As such, ink flows from reservoir 15 to inkjet printhead assembly 12. Ink supply assembly 14 and inkjet printhead assembly 12 can form either a one-way ink delivery system or a recirculating ink delivery system. In a one-way ink delivery system, substantially all of the ink supplied to inkjet printhead assembly 12 is consumed during printing. In a recirculating ink delivery system, however, only a portion of the ink supplied to printhead assembly 12 is consumed during printing. As such, ink not consumed during printing is returned to ink supply assembly 14.

In one embodiment, inkjet printhead assembly 12 and ink supply assembly 14 are housed together in an inkjet cartridge or pen. In another embodiment, ink supply assembly 14 is separate from inkjet printhead assembly 12 and supplies ink to inkjet printhead assembly 12 through an interface connection, such as a supply tube. In either embodiment, reservoir 15 of ink supply assembly 14 may be removed, replaced, and/or refilled. In one embodiment, where inkjet printhead assembly 12 and ink supply assembly 14 are housed together in an inkjet cartridge, reservoir 15 includes a local reservoir located within the cartridge as well as a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly. As such, mounting assembly 16 includes a carriage for moving inkjet printhead assembly 12 relative to media transport assembly 18 to scan print medium 19. In another embodiment, inkjet printhead assembly 12 is a non-scanning type printhead assembly. As such, mounting assembly 16 fixes inkjet printhead assembly 12 at a prescribed position relative to media transport assembly 18. Thus, media transport assembly 18 positions print medium 19 relative to inkjet printhead assembly 12.

Electronic controller or printer controller 20 typically includes a processor, firmware, and other printer electronics for communicating with and controlling inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical, or other information transfer path. Data 21 represents, for example, a document and/or file to be printed. As such, data 21 forms a print job for inkjet printing system 10 and includes one or more print job commands and/or command parameters.

In one embodiment, electronic controller 20 controls inkjet printhead assembly 12 for ejection of ink drops from nozzles 13. As such, electronic controller 20 defines a pattern of ejected ink drops which form characters, symbols, and/or other graphics or images on print medium 19. The pattern of ejected ink drops is determined by the print job commands and/or command parameters.

In one embodiment, inkjet printhead assembly 12 includes one printhead 40. In another embodiment, inkjet printhead assembly 12 is a wide-array or multi-head printhead assembly. In one wide-array embodiment, inkjet printhead assembly 12 includes a carrier, which carries printhead dies 40, provides electrical communication between printhead dies 40 and electronic controller 20, and provides fluidic communication between printhead dies 40 and ink supply assembly 14.

Figure 2:
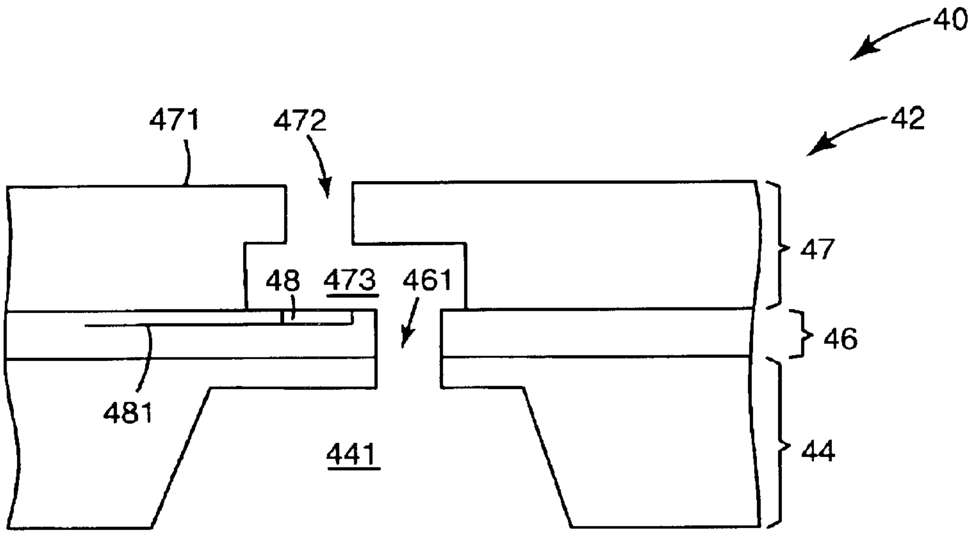
FIG. 2 is an enlarged schematic cross-sectional view illustrating portions of one embodiment of a printhead die in the printing system of FIG. 1.

A portion of one embodiment of a printhead die 40 is illustrated schematically in FIG. 2. Printhead die 40 includes an array of printing or drop ejecting elements 42. Printing elements 42 are formed on a substrate 44 which has an ink feed slot 441 formed therein. As such, ink feed slot 441 provides a supply of liquid ink to printing elements 42. Each printing element 42 includes a thin-film structure 46, an orifice layer 47, and a firing resistor 48. Thin-film structure 46 has an ink feed channel 461 formed therein which communicates with ink feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and ink feed channel 461 of thin-film structure 46. Firing resistor 48 is positioned within nozzle chamber 473 and includes leads 481 which electrically couple firing resistor 48 to a drive signal and ground.

During printing, ink flows from ink feed slot 441 to nozzle chamber 473 via ink feed channel 461. Nozzle opening 472 is operatively associated with firing resistor 48 such that droplets of ink within nozzle chamber 473 are ejected through nozzle opening 472 (e.g., normal to the plane of firing resistor 48) and toward a print medium upon energization of firing resistor 48.

Example embodiments of printhead dies 40 include a thermal printhead, a piezoelectric printhead, a flex-tensional printhead, or any other type of inkjet ejection device known in the art. In one embodiment, printhead dies 40 are fully integrated thermal inkjet printheads. As such, substrate 44 is formed, for example, of silicon, glass, or a stable polymer and thin-film structure 46 is formed by one or more passivation or insulation layers of silicon dioxide, silicon carbide, silicon nitride, tantalum, poly-silicon glass, or other suitable material. Thin-film structure 46 also includes a conductive layer which defines firing resistor 48 and leads 481. The conductive layer is formed, for example, by aluminum, gold, tantalum, tantalum-aluminum, or other metal or metal alloy.

Printhead assembly 12 can include any suitable number (P) of printheads 40, where P is at least one. Before a print operation can be performed, data must be sent to printhead 40. Data includes, for example, print data and non-print data for printhead 40. Print data includes, for example, nozzle data containing pixel information, such as bitmap print data. Non-print data includes, for example, command/status (CS) data, clock data, and/or synchronization data. Status data of CS data includes, for example, printhead temperature or position, printhead resolution, and/or error notification.

Figure 3:
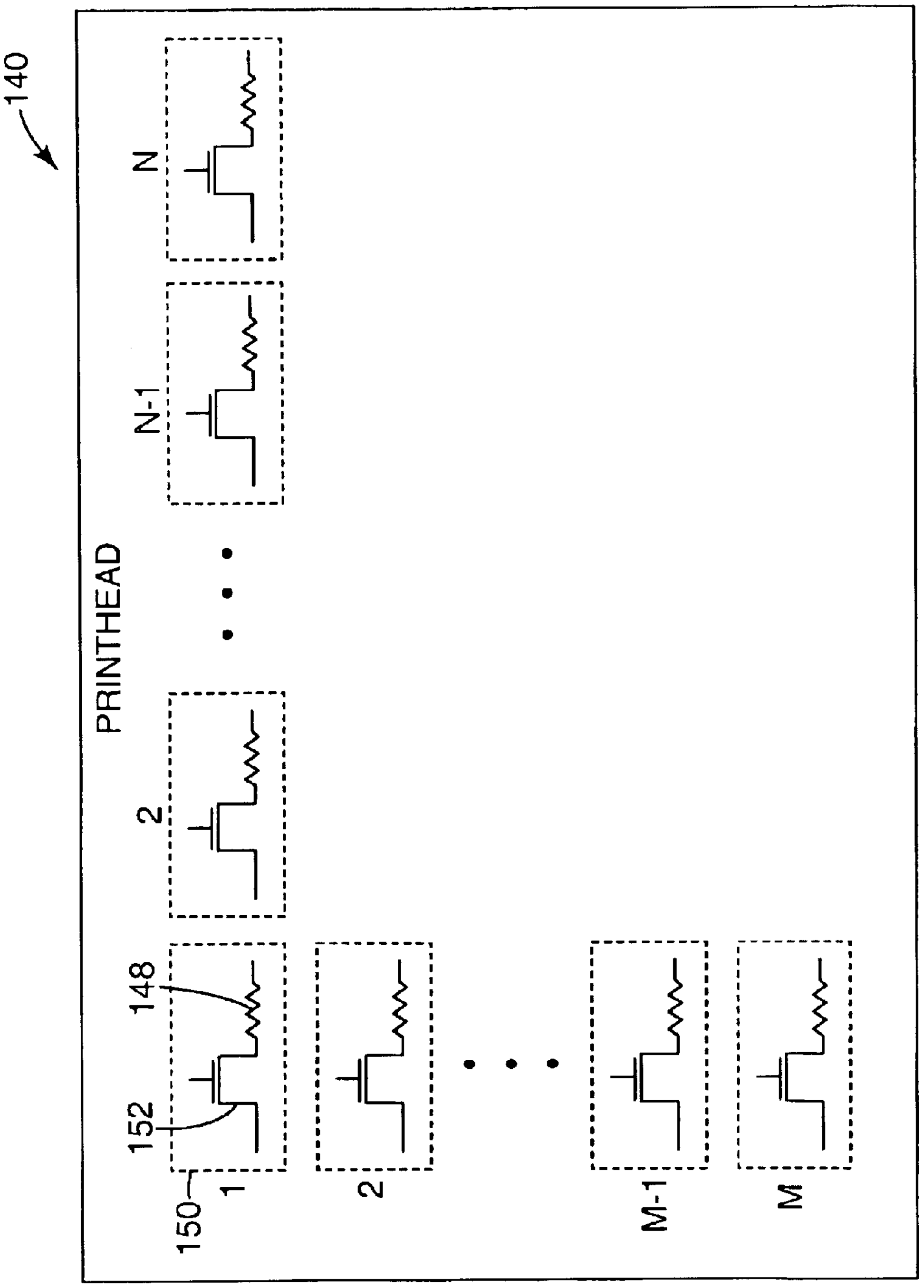
FIG. 3 is a block diagram illustrating portions of one embodiment of an inkjet printhead having one or more firing resistor and switching transistors.

One embodiment of an example printhead 140 is illustrated generally in block and schematic diagram form in FIG. 3. Printhead 140 includes multiple firing resistors 148 which are each coupled to a corresponding switching transistor 152. The illustrated configuration of firing resistors 148 and switching transistors 152 is only one of many possible configurations, but the general operation of the switching transistors and firing resistors described below can be applied to other configurations. In one embodiment, switching transistor 152 is a field effect transistor (FET) which may be fabricated on a Metal-Oxide Semiconductor (MOS) process, such as a Complementary MOS (CMOS) process. In the embodiments discussed below, switching transistor 152 is an n-channel transistor, but it is understood that switching transistor 152 may also be a p-channel transistor.

In the example configuration illustrated in FIG. 3, printhead 140 includes M primitives 150, where each primitive is arranged in a row. Each primitive includes N pairs of firing resistors 148 and switching transistors 152. As a result, the firing resistor/switching transistor pairs are arranged in M rows and N columns which are all coupled to electronic controller 20 in a row/column multiplexing approach, where M is at least one and N is at least one. The drain of each switching transistor 152 is coupled to the associated firing resistor 148. A single lead couples the source of each switching transistor 152 to ground. Alternatively, each switching transistor 152 in each of the M rows is coupled to a separate ground. Each of the N columns of switching transistors 152 is controlled with a separately energizable address lead coupled to every gate of switching transistor 152 in a given column. Each of the M rows forms a primitive wherein each of the M rows of firing resistors 148 is controlled by providing power through a separately energizable primitive lead coupled to every firing resistor 148 in a given primitive row.

By energizing a single address lead and one or more of the up to M primitive leads, only one switching transistor 152 is turned on at a given time in each of the up to M primitive rows so that at most a single firing resistor 148 in each of the primitive rows has electrical current passed through it to heat the ink in a corresponding selected vaporization chamber. The total number of firing resistors 148 having electrical current passed through at a given time is equal to the number of primitive rows being energized.

One example embodiment of a method according to the present invention for fabricating a power switching transistor 114 is illustrated sequentially in cross-sectional views in FIGS. 4A through 4G.

Figure 4A:
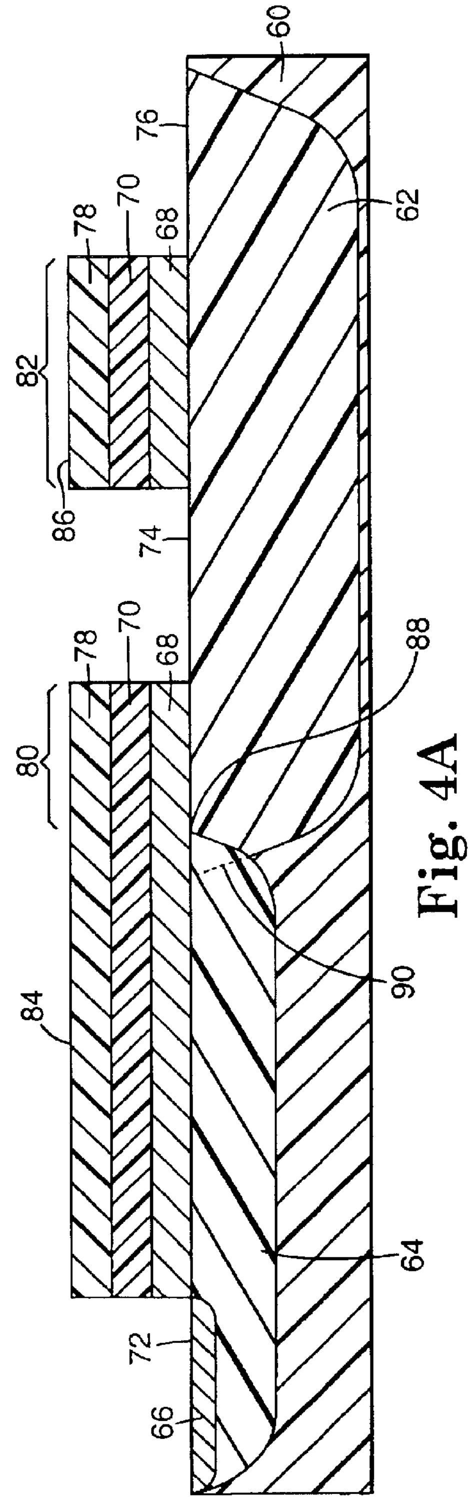
FIGS. 4A–4G are cross-sectional views which illustrate sequentially a switching transistor fabrication method according to embodiments of the present invention.

FIG. 4A is a cross-sectional view illustrating the initial film stacks formed to define the active areas. In the example embodiment illustrated in FIGS. 4A through 4G, the process illustrated is a (CMOS) twin well process. It is understood however, that in other embodiments, a single well process such as an N-well CMOS process or a P-well CMOS process may be used. In one embodiment, the method according to the present invention for fabricating the power switching transistor 114 includes many well known standard CMOS processing steps. As such, the fabrication steps described below relate to understanding and practicing the present invention, and for clarity some of the well known CMOS process steps not related to understanding and practicing the present invention are not described below.

In one embodiment, a semiconductor substrate 60 is used as a starting material. Semiconductor substrate 60 is a p-type substrate having a resistivity of 10–20 Ω/square. While a p-type substrate is illustrated in this example embodiment, the type of substrate used is not restricted to p-type.

In the example embodiment shown in FIG. 4A, the initial processing steps for the twin well process have already been completed. In the example embodiment, the n-well photo and implant steps have been completed and the first conductivity type region 62 is a first well which has been formed to have a defined n-type impurity concentration, such as $1\times10^{16}$ particles/$cm^3$. In one embodiment, the n-well 62 implant is tuned to set the p-channel threshold voltages in order to save a later implant step.

In the example embodiment, the p-well photo and implant steps have been completed and the second conductivity type region 64 is a second well which has been formed to have a defined p-type impurity concentration, such as $1\times10^{16}$ particles/$cm^3$. In one embodiment, the p-well 64 implant is tuned to set the n-channel threshold voltages in order to save a later implant step. In alternative embodiments, the n-well 62 and p-well 64 implant and photolithography steps are performed in a different order and further may have other suitable defined implant concentrations which are greater than or less than $1\times10^{16}$ particles/$cm^3$. In other embodiments, the n-channel and p-channel transistor threshold adjust implants may not be performed, or may be performed at a different time during the sequence of processing steps.

In the example embodiment, the first conductivity type region 62 is a first well 62 due to formation through well photolithography and implant steps, and because first well 62 is n-type it is an n-well 62. In other embodiments, first well 62 is a p-well if it is formed through an implant step using a p-type impurity. Furthermore, in other embodiments, first conductivity type region 62 is a semiconductor substrate 60 if first conductivity type region 62 is not formed through well photolithography and implant steps.

In the example embodiment, the second conductivity type region 64 is a second well 64 due to formation through well photolithography and implant steps, and because second well 64 is p-type, it is a p-well 64. In other embodiments, second well 64 is an n-well if it is formed through an implant step using an n-type impurity. Furthermore, in other embodiments, second conductivity type region 64 may be a semiconductor substrate 60 if second conductivity type region 64 is not formed through well photolithography and implant steps.

In one embodiment, if the first conductivity type of the first conductivity type region 62 is n-type, the second conductivity type of the second conductivity type region 64 will be p-type. Conversely, if the first conductivity type of the first conductivity type region 62 is p-type, the second conductivity type of the second conductivity type region 64 will be n-type.

In the example embodiment illustrated in FIG. 4A, a p-well field implant 66 has been completed. In one embodiment, boron is used as the implant impurity. In other embodiments, any suitable p-type acceptor impurity is used. In one embodiment, an n-well field implant is completed using an n-type impurity as the implant impurity. In one embodiment, p-well field implant 66 increases the later formed FET drain to source voltage by increasing both the punch-through breakdown voltage and the threshold voltage of parasitic field transistors.

In the example embodiment illustrated in FIG. 4A, the initial active area film stack has already been formed and etched so that the remaining film stacks define the active areas. In the example embodiment, a Stress Relief Oxide (SRO) layer 68 having a defined thickness, such as 200 Angstroms, is formed over semiconductor substrate 60. In the example embodiment, a Silicon Nitride layer ($Si_3N_4$) 70 having a defined thickness, such as 900 Angstroms, is formed over SRO layer 68. In the example embodiment, $Si_3N_4$ 70 and SRO layer 68 have already been patterned and etched to expose the field regions 72, 74 and 76. In one embodiment, to complete the pattern and etch steps required to expose field regions 72, 74 and 76, a photoresist layer 78 is exposed to ultraviolet (UV) light to define the field regions which lie outside of the device active areas where the FET is formed. Following UV exposure, portions of photoresist layer 78 are removed from field regions 72, 74 and 76. In one embodiment, the portions of $Si_3N_4$ layer 70 and SRO layer 68 not covered by hardened photoresist after the portions of photoresist layer 78 are removed, are etched away by using hydrofluoric acid (HF). In alternative embodiments, a chemical solvent such as hydrochloric acid is used to etch the uncovered potions of $Si_3N_4$ layer 70 and SRO layer 68. In alternative embodiments, a dry etch (plasma) process is used to etch the uncovered potions of $Si_3N_4$ layer 70 and SRO layer 68. In other embodiments, the steps of patterning and etching $Si_3N_4$ layer 70 and SRO layer 68 is performed at a different time during the sequence of processing steps depending on the particular process being used to fabricate the FET.

When defining prior art n-channel and p-channel FETs, active area film stacks formed over p-wells define n-channel FETs and active area film stacks formed over n-wells define p-channel FETs. In the example embodiment illustrated in FIG. 4A, regions 80 and 82 illustrate portions of the n-channel active area film stacks 84 and 86 which are allowed to overlap n-well 62 when forming the n-channel FET. In alternative embodiments, portions of a p-channel active area film stack could overlap p-well 64.

FIG. 4A illustrates that when forming one embodiment of the FET 114, active area film stack 86 is formed over n-well 62. Active area film stack 84 overlaps both n-well 62 and p-well 64, allowing the later formed polysilicon gate to also overlap both n-well 62 and p-well 64. While the boundary between n-well 62 and p-well 64 is defined in FIG. 4A to be the edge of p-well 64 indicated at 88, in alternative embodiments, there is some overlap between p-well 64 and the original implant boundary of n-well 62 as indicated at 90. In one embodiment, active area film stack 84 overlaps both n-well 62 and p-well 64, and does not restrict the boundary between n-well 62 and p-well 64 in regards to whether there is or is not an overlap between the original implant boundary 90 of n-well 62 and edge 88 of p-well 64.

Figure 4B:
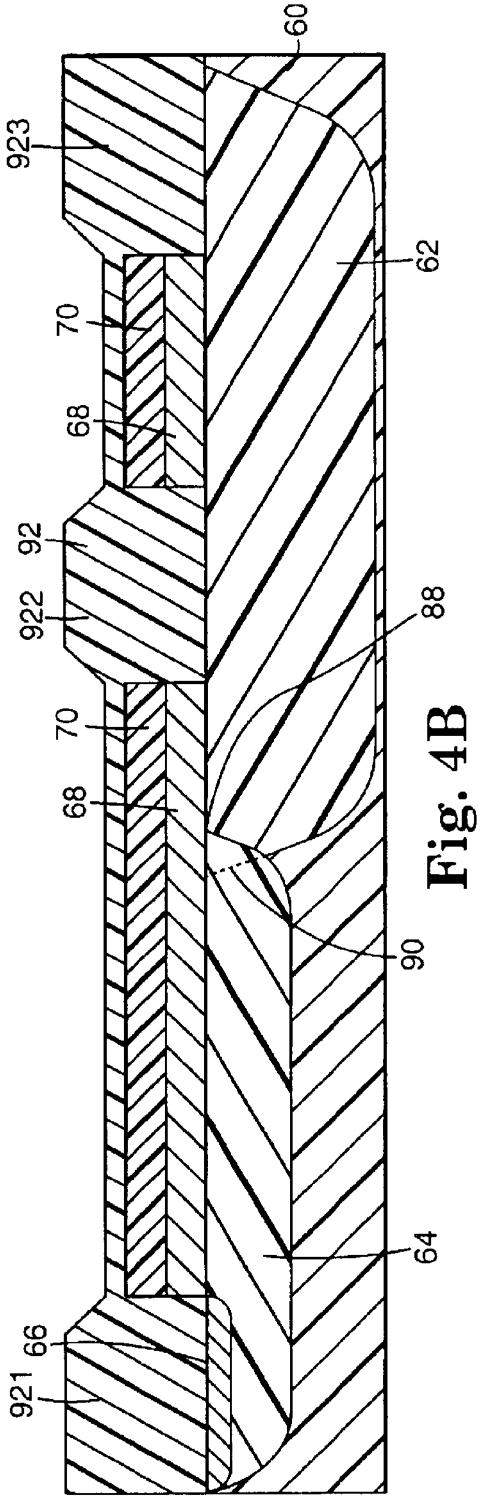

FIG. 4B is a cross-sectional view illustrating the formation of field oxide 92. In one embodiment, field oxide 92 is formed by first removing photoresist layer 78 to expose $Si_3N_4$ layer 70. $Si_3N_4$ layer 70 is a dielectric material which is used as a barrier against the oxidation of silicon during formation of the field oxide. In one embodiment, field oxide 92 is formed to a defined thickness, such as 7,000 Angstroms, through a Local Oxidation of Silicon (LOCOS) process using $Si_3N_4$ layer 70 as the oxidation barrier. After the step of forming field oxide 92 is complete, field oxide 92 will have field oxide regions 921, 922 and 923. In one embodiment, the step of forming field oxide 92 also is used as a p-well 64 drive to diffuse the p-well implant impurity into substrate 60.

Figure 4C:
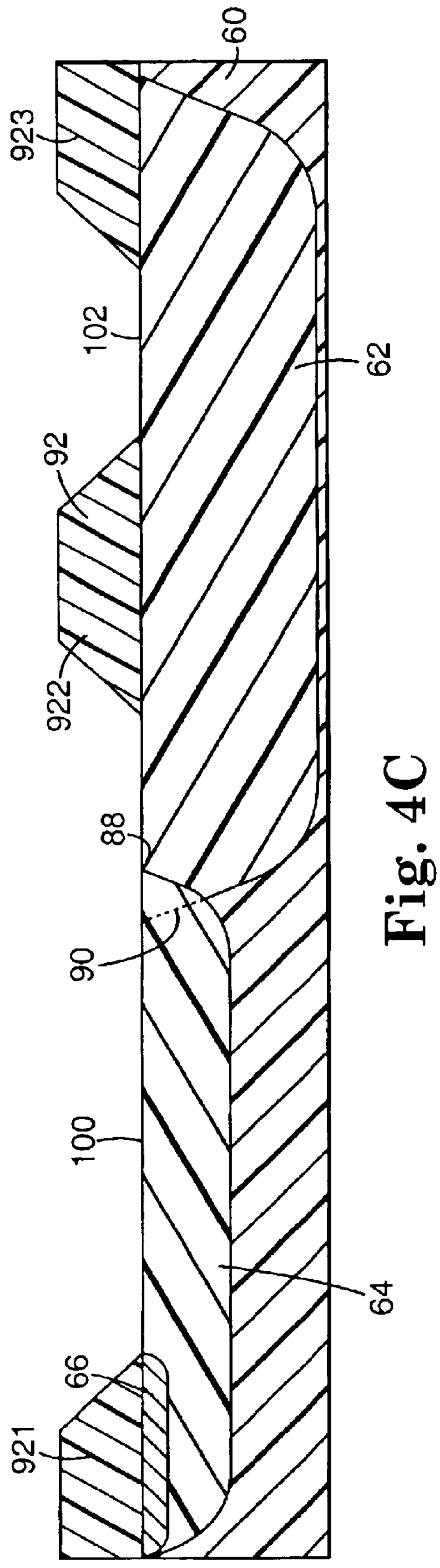

FIG. 4C is a cross-sectional view illustrating the formation of the active area regions prior to gate oxidation. In one embodiment, the portion of field oxide 92 over $Si_3N_4$ layer 70 is etched away using HF. Next, $Si_3N_4$ layer 70 is etched away. In one embodiment, a phosphoric acid etch is used to etch $Si_3N_4$ layer 70 away. Lastly, SRO layer 68 is etched away to expose surfaces 100 and 102 of semiconductor substrate 60. In one embodiment, SRO layer 68 is etched away using HF. In one embodiment, field oxide 92 is formed to have a defined post-processing thickness, such as 5,000 Angstroms.

Figure 4D:
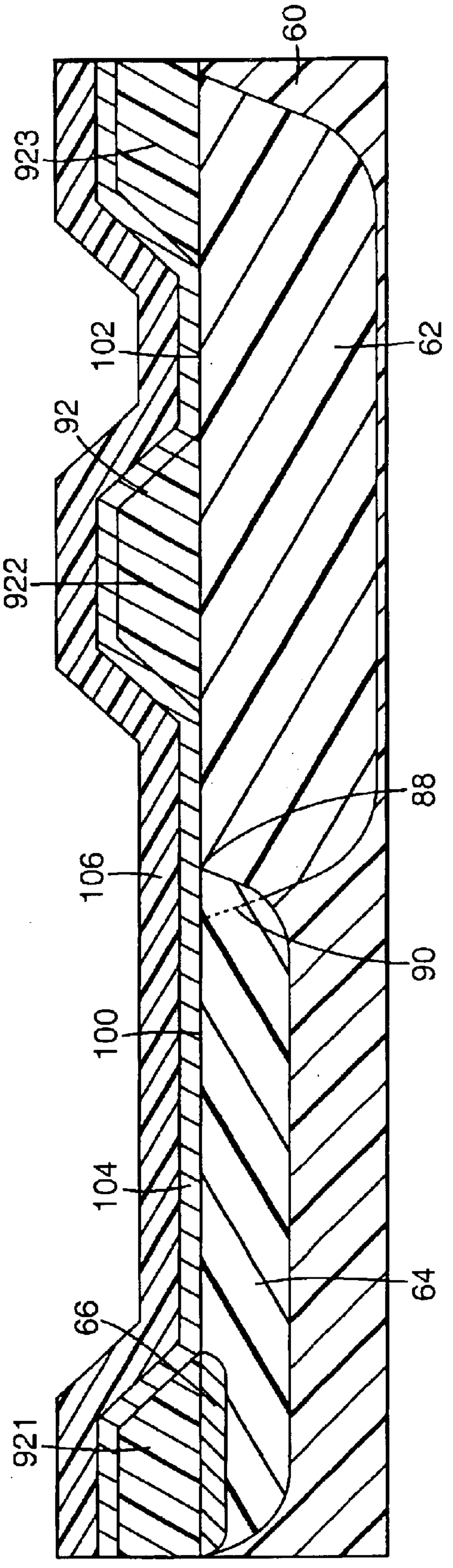

FIG. 4D is a cross-sectional diagram which illustrates the formation of gate oxide layer 104 and polysilicon layer 106. In one embodiment, gate oxide layer 104 is formed by thermal oxidation to a defined thickness, such as 200 Angstroms. In one embodiment, polysilicon layer 106 is formed by chemical vapor deposition (CVD) to a defined thickness, such as 3,500 Angstroms. In undoped form, polysilicon layer 106 has relatively high resistivity for a gate structure, and as such, in one embodiment is doped with an impurity in order to lower the resistivity to a level suitable for functionality as a gate. In one embodiment, polysilicon layer 106 is doped with an n-type dopant. In one embodiment, polysilicon layer 106 is doped with phosphorus. In one embodiment, polysilicon layer 106 is doped with PoCl3. In other embodiments, polysilicon layer 106 is doped with a p-type dopant.

Figure 4E:
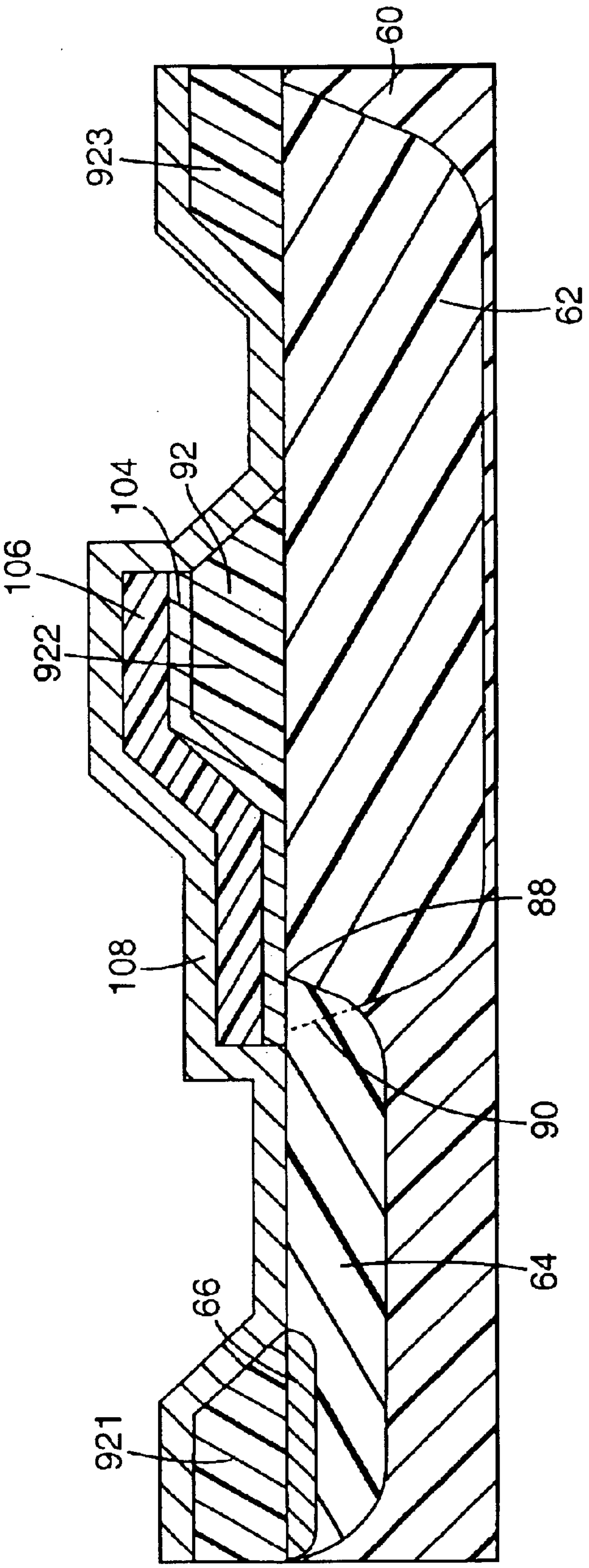

FIG. 4E is a cross-sectional view which illustrates the etching of polysilicon layer 106 and gate oxide layer 104 to define the drain, gate and source areas of the FET. Polysilicon layer 106 and gate oxide layer 104 undergo a photolithography step to define the gate regions. Next, an etch process is completed to etch the gate structure. In one embodiment, a dry etch process is used to etch the gate structure.

In one embodiment, an oxidation layer 108 is next formed. In one embodiment, the step of forming oxidation layer 108 also functions as a thermal impurity drive-in step. In one embodiment, oxidation layer 108 is formed to a defined thickness, such as 450 Angstroms.

Figure 4F:
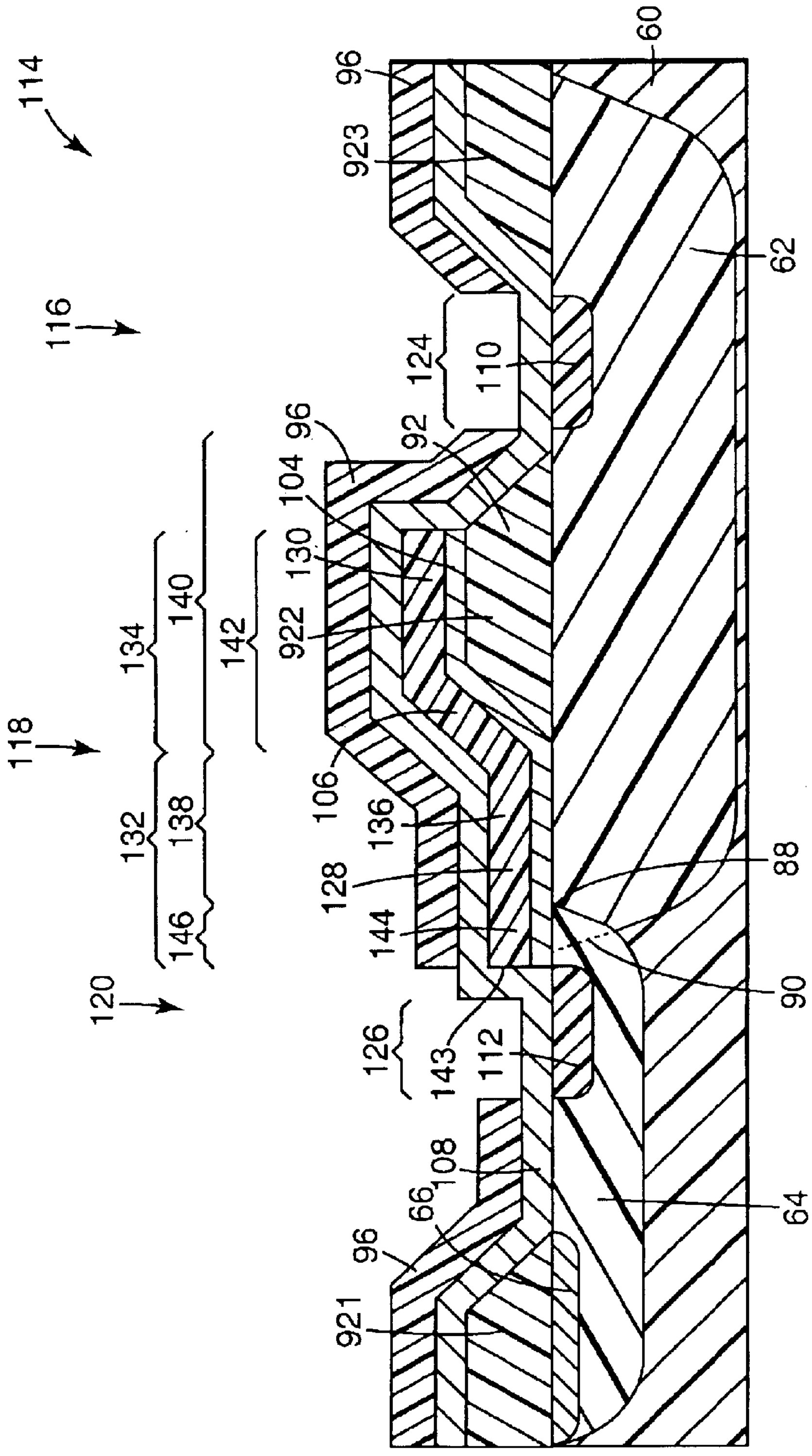

FIG. 4F is a cross-sectional view illustrating the formation of a first diffused region 110 and a second diffused region 112. Once the first diffused region 110 and the second diffused region 112 are formed, the FET is formed. The FET, illustrated generally at 114, has a drain 116, a gate 118 and a source 120.

To form FET 114, a photoresist layer 96 is deposited and etched to expose areas 124 and 126 which define the regions where the surface of semiconductor substrate 60 will be implanted to create the first diffused region 110 and the second diffused region 112, respectively. Next an ion implantation and drive-in step is completed. In one embodiment, areas 124 and 126 are implanted with an n-type impurity. In one embodiment, areas 124 and 126 are implanted with arsenic. In one embodiment, areas 124 and 126 are implanted with phosphorus. In one embodiment, areas 124 and 126 are implanted with PoCl3. In one embodiment, the n-type impurity concentration of first diffused region 110 and second diffused region 112 is a defined concentration, such as $1\times10^{20}$ particles/$cm^3$. In one embodiment, after the ion implantation and drive-in steps are completed, the first diffused region 110 has a defined n-type impurity concentration, such as $1\times10^{20}$ particles/$cm^3$, which is greater than the impurity concentration of n-well 62 which has a defined n-type impurity concentration, such as $1\times10^{16}$ particles/$cm^3$. While an n-channel FET 114 is being formed in the example embodiment, in other embodiments, areas 124 and 126 are implanted with a p-type impurity to form a p-channel FET. In other embodiments, other suitable impurity concentrations can be used for first diffused region 110 and n-well 62, so long as first diffused region 110 has a greater impurity concentration than n-well 62 and the impurity concentration of n-well 62 is sufficient to enable FET 114 to operate as a field effect device at a desired operating voltage.

Gate 118 has both a thin oxide region 128 and a thick oxide region 130. Thin oxide region 128 has a length indicated by dimension 132 and thick oxide region 130 has a length indicated by dimension 134. Thick oxide region 130 and a portion 136 of thin oxide region 128 overly the n-well 62. Portion 136 has a length indicated by dimension 138. Portion 136 is spaced at a distance from first diffused region 110 as indicated by dimension 140. Thick oxide region 130 overlies field oxide region 922 as indicated by dimension 142.

A second portion 144 of thin oxide region 128 is disposed over p-well 64 as indicated by dimension 146. Second diffused region 112 is adjacent to edge 143 of second portion 144 of thin oxide region 128 of gate 118. In one embodiment, second diffused region 112 is created by ion implantation and drive-in steps using polysilicon layer 106 as a self-aligned ion implantation mask.

The effective channel length or effective gate length of FET 114 is defined as the length that second portion 144 of thin oxide region 128 is disposed over p-well 64 as indicated by dimension 146. The distance between the start of the effective channel region at edge 88 of p-well 64 and first diffused region 110 is defined as defined distance 152. The defined distance 152 is equal to dimension 138 plus dimension 140 as illustrated in FIG. 4F. The portion of n-well 62 between edge 88 of p-well 64 and first diffused region 110 acts as a lateral series drain resistance which drops the drain 116 voltage between first diffused region 110 and edge 88 of p-well 64. In one embodiment, the defined distance can be increased to support a higher drain 116 voltage by increasing the overlap of active area film stack 84 over n-well 62. In one embodiment, the defined distance can be decreased if a smaller drain 116 voltage is required by decreasing the overlap of active area film stack 84 over n-well 62.

In one embodiment, the FET 114 drain to source voltage is increased by extending the length of drain 116 into n-well 62 thereby increasing the avalanche breakdown voltage of the first diffused region 110 drain junction by allowing the depletion region of first diffused region 110 to extend into n-well 62.

In one embodiment, the FET 114 drain to source voltage is increased because the resistance of n-well 62 between edge 88 of p-well 64 and first diffusion 110 drops the drain 116 voltage thus reducing the electric field along thin oxide region 128 and thereby increasing the gate oxide breakdown voltage.

In one embodiment, the FET 114 drain to source voltage is increased because thick oxide region 130 extends polysilicon layer 106 over field oxide region 922 thereby reshaping the vertical electric field across gate oxide 104 along thin oxide region 128, thus reducing the peak electric field across gate oxide 104 under thin oxide region 128.

In one embodiment, the FET 114 drain to source voltage is increased because field oxide region 922 at the defined thickness, such as 5,000 Angstroms, is 25 times thicker than gate oxide layer 104 at the defined thickness, such as 200 Angstroms. Because oxides can typically withstand electric fields on the order of 1 v/nm, and because the lateral series resistance of n-well 62 along defined resistance 152 drops the drain 116 voltage, the peak electric field along thin oxide region 128 is reduced, thereby avoiding breakdown of either the gate oxide 104 under thin oxide region 128, or the field oxide region 922 under thick oxide region 130.

Figure 4G:
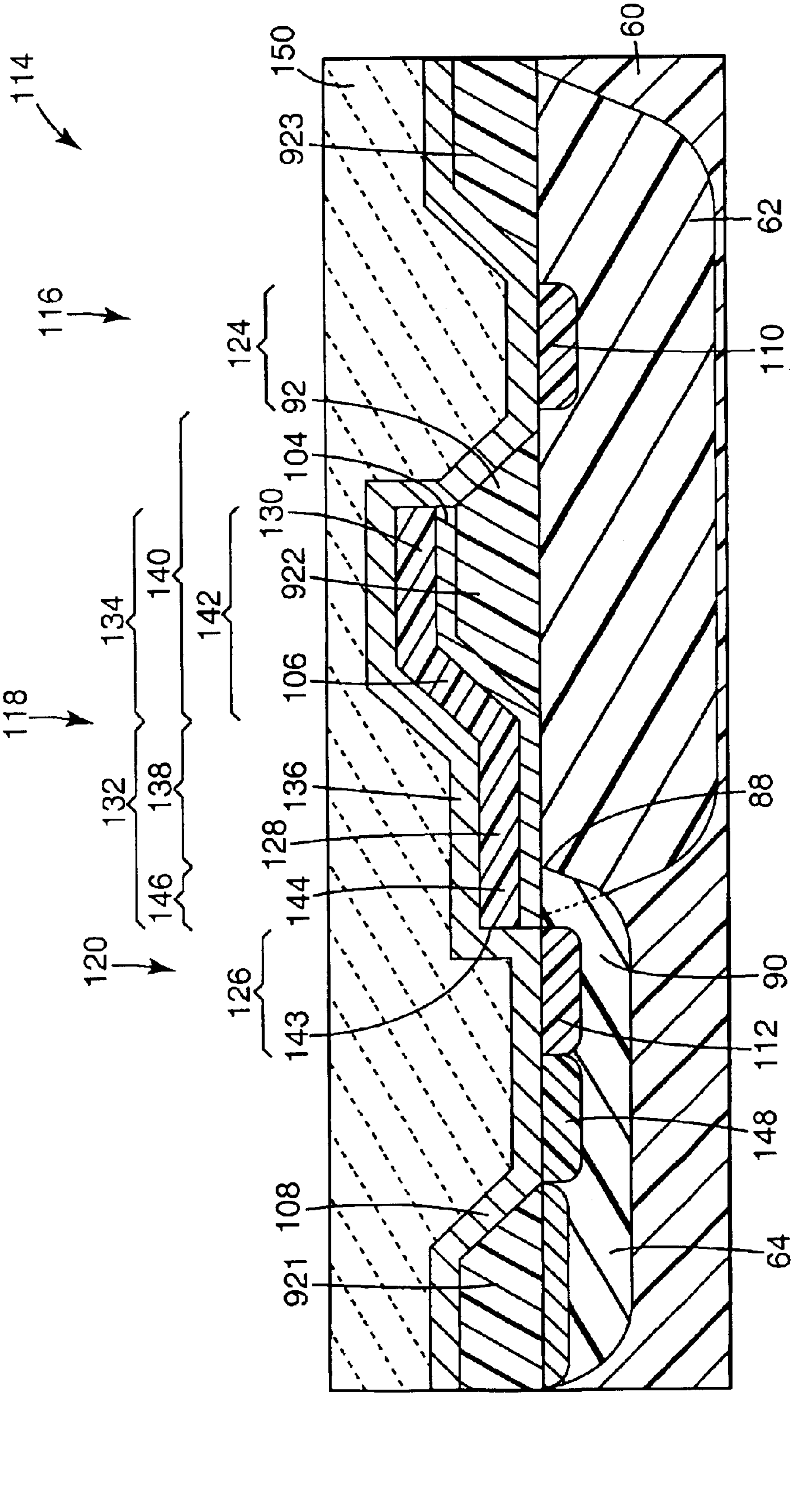

FIG. 4G is a cross-sectional view illustrating additional steps of formation of FET 114. After the photoresist layer 96 is removed, in one embodiment, photolithography, etch, ion implantation and drive-in steps are completed to define a p-well contact to ground to ensure a robust connection between p-well 64 and ground. The supply diffusion is illustrated as third diffused region 148. In one embodiment, the diffusion is p-type. In one embodiment, the impurity used to implant the third diffused region is boron. In one embodiment, the third diffused region is implanted to have a defined impurity concentration, such as $1\times10^{20}$ particles/$cm^3$. Although in the example embodiment an n-channel FET 114 is being formed, in other embodiments a p-channel FET is formed and third diffused region will be n-type.

Next, photoresist layer 96 is removed. In one embodiment, a dielectric layer 150 is formed over FET 114. In one embodiment, the dielectric layer is a Tetraethyl Orthosilicate (TEOS) oxide. In one embodiment, the dielectric layer is phosphosilicate glass (PSG). In one embodiment, the dielectric layer is a spin-on glass oxide.

Electrical contact is made to FET 114 for drain 116 at first diffused region 110, for gate 118 at polysilicon layer 106, and for source 120 at second diffused region 112. The subsequent fabrication steps required to form the contact, metal and via layers required to electrically connect FET 114 to other electrical devices or circuits are not shown. In additional embodiments, it is contemplated that one or more metal layers are formed to electrically connect FET 114 to other electrical devices or circuits.

One embodiment of the above manufacturing process can enable inkjet printhead manufacturers to produce higher value products. This is accomplished by integrating industry standard low voltage logic, higher resistance thin film resistors and high voltage switching FETs by using a cost effective integrated circuit manufacturing process flow.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments illustrated and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of manufacturing a power switching transistor for a fluid section device, the method comprising:

forming a first conductivity type region;

forming a first diffused region within the first conductivity type region, wherein the first diffused region has a first conductivity type and has a greater impurity concentration than the first conductivity type region;

forming a gate defined to have a thin oxide region and a thick oxide region, wherein the thick oxide region and a first portion of the thin oxide region are disposed over the first conductivity type region, and wherein the thin oxide region is at a defined distance from the first diffused region; and forming a second diffused region within a second conductivity type region, wherein a second portion of the thin oxide region of the gate is disposed over the second conductivity type region, wherein the second diffused region is adjacent to an edge of the second portion of the thin oxide region of the gate, and wherein the second diffused region has the first conductivity type.

2. The method of claim 1 further comprising:

forming a field oxide over the first conductivity type region wherein the thick oxide region of the gate overlays at least a portion of the field oxide.

3. The method of claim 1, wherein the first conductivity type region is a first well and the second conductivity type region is a second well.

4. The method of claim 1, wherein the first conductivity type region is a first well and the second conductivity type region is a semiconductor substrate.

5. The method of claim 1, wherein forming the second diffused region includes self-aligning the second diffused region to the edge of the second portion of the thin oxide region of the gate.

6. The method of claim 1, wherein the first conductivity type is n-type and the second conductivity type is p-type.

7. The method of claim 1, wherein the first conductivity type is p-type and the second conductivity type is n-type.

8. The method of claim 1, wherein the first portion of the thin oxide region of the gate is at a first defined distance from the first diffused region and the second portion of the thin oxide region of the gate is at a second defined distance from the first diffused region.

9. The method of claim 8, further comprising selecting the second defined distance to support a desired drain voltage.

10. A method of manufacturing a power switching transistor for a fluid ejection device, the method comprising:

forming a first conductivity type region;

forming a first diffused region within the first conductivity type region, wherein the first diffused region has a first conductivity type and has a greater impurity concentration than the first conductivity type region;

forming a gate defined to have a thin oxide region and a thick oxide region, wherein the thick oxide region and a first portion of the thin oxide region are disposed over the first conductivity type region; and forming a second conductivity type region, wherein a second portion of the thin oxide region of the gate is disposed over the second conductivity type region, wherein the second portion of the thin oxide region of the gate is at a defined distance from the first diffused region, wherein the defined distance is selected to provide a desired drain voltage.

11. The method of claim 10 further comprising:

forming a field oxide over the first conductivity type region wherein the thick oxide region of the gate overlays at least a portion of the field oxide.

12. The method of claim 10, wherein the first conductivity type region is a first well and the second conductivity type region is a second well.

13. The method of claim 10, wherein the first conductivity type region is a first well and the second conductivity type region is a semiconductor substrate.

14. The method of claim 13 further comprising:

forming a second diffused region within the second conductivity type region, wherein the second diffused region is adjacent to an edge of the second portion of the thin oxide region of the gate, and wherein the second diffused region has the first conductivity type.

15. The method of claim 14, wherein forming the second diffused region includes self-aligning the second diffused region to the edge of the second portion of the thin oxide region of the gate.

16. The method of claim 14, wherein the first conductivity type is n-type and the second conductivity type is p-type.

17. The method of claim 14, wherein the first conductivity type is p-type and the second conductivity type is n-type.

* * * * *